United States Patent
McRae et al.

(10) Patent No.: US 8,120,405 B1
(45) Date of Patent: *Feb. 21, 2012

(54) METHOD AND APPARATUS FOR AN OUTPUT BUFFER WITH DYNAMIC IMPEDANCE CONTROL

(75) Inventors: Duncan McRae, Parramatta (AU); Russell Hayter, Wyoming (AU)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/419,454

(22) Filed: May 19, 2006

Related U.S. Application Data (63) Continuation of application No. 10/765,370, filed on Jan. 27, 2004.

(51) Int. Cl.
*H03B 1/00* (2006.01)

(52) U.S. Cl. .................. 327/205; 327/206; 327/170

(58) Field of Classification Search ............... 327/108, 327/112, 170, 205, 206; 326/26, 27, 82, 326/83
See application file for complete search history.

(56) References Cited

U.S. PATENT DOCUMENTS

| | | | | |
|---|---|---|---|---|
| 5,594,361 A * | 1/1997 | Campbell | ............... | 326/24 |
| 5,760,649 A * | 6/1998 | Michail et al. | ............... | 330/264 |
| 5,900,787 A * | 5/1999 | Yoshimura | ............... | 331/116 FE |
| 5,907,254 A * | 5/1999 | Chang | ............... | 327/165 |
| 6,177,819 B1 * | 1/2001 | Nguyen | ............... | 327/112 |
| 6,310,496 B1 * | 10/2001 | Nomura | ............... | 327/112 |
| 6,329,872 B1 * | 12/2001 | Foroudi | ............... | 327/541 |
| 6,680,637 B2 * | 1/2004 | Seo | ............... | 327/175 |
| 7,009,432 B2 * | 3/2006 | Beghein | ............... | 327/157 |
| 7,126,389 B1 * | 10/2006 | McRae et al. | ............... | 327/112 |

* cited by examiner

*Primary Examiner* — Long Nguyen
(74) *Attorney, Agent, or Firm* — Heimlich Law, PC; Alan Heimlich, Esq.

(57) ABSTRACT

A method and apparatus for an output buffer with dynamic impedance control have been disclosed.

2 Claims, 10 Drawing Sheets

METHOD AND APPARATUS FOR AN OUTPUT BUFFER WITH DYNAMIC IMPEDANCE CONTROL

RELATED APPLICATION

The present application for patent is a continuation of U.S. patent application Ser. No. 10/765,370 titled "Method and Apparatus for an Output Buffer with Dynamic Impedance Control" filed Jan. 27, 2004, pending, by the same inventors, and is hereby incorporated herein by reference.

FIELD OF THE INVENTION

The present invention pertains to output buffers. More particularly, the present invention relates to a method and apparatus for an output buffer with dynamic impedance control.

BACKGROUND OF THE INVENTION

Output buffers are an integral part of electronics. Their use is wide and diverse. They are used to drive a variety of other devices both active and passive, for example, logic, microprocessors, bus clocks, resistors, capacitors, backplanes, etc. When driving such a variety of devices and depending upon the load presented to the output buffer it is possible to have effects which may not be wanted. For example, ringing, overshoot, undershoot, EMI (electromagnetic interference), etc. This presents a problem.

Figure 1:
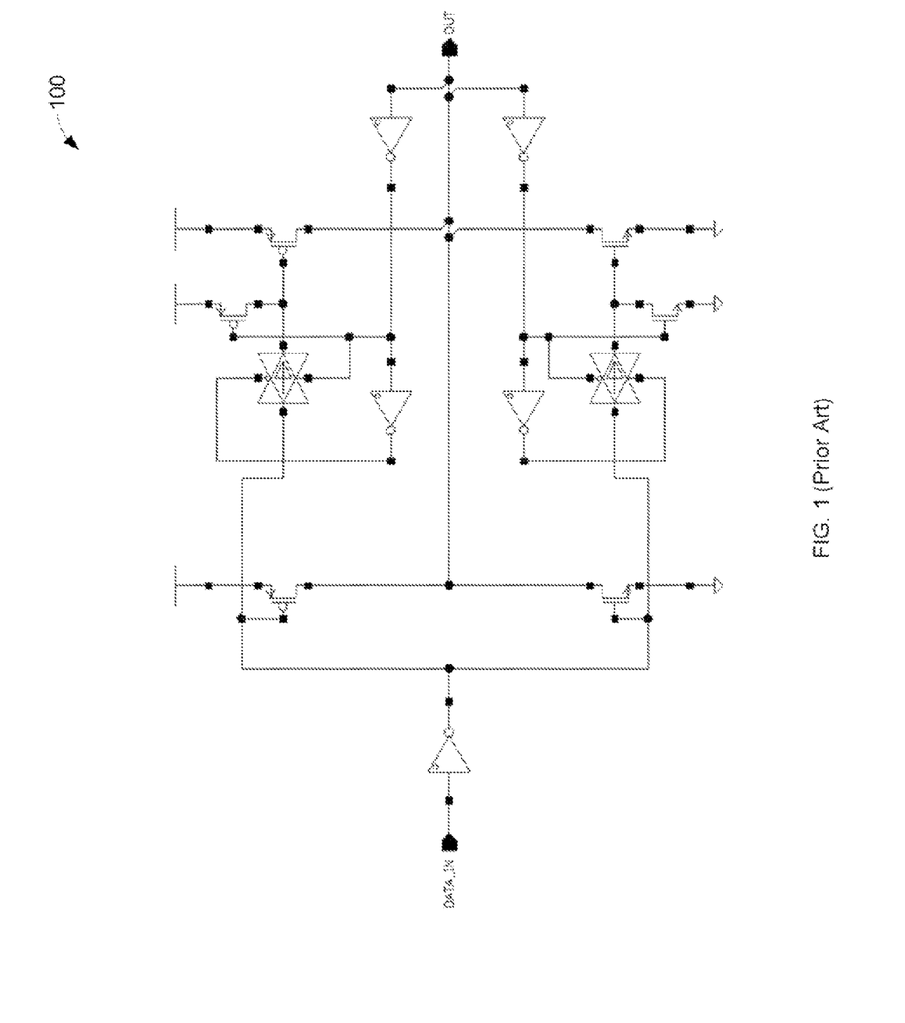
FIG. 1, FIG. 2, and FIG. 3 illustrate some current approaches.

For example, FIG. 1 illustrates one current approach 100 having a dynamic output control. One of skill in the art will recognize that FIG. 1 uses a level-detect circuit (the feedback inverters connected at the output) to determine when the output has passed a fixed threshold. Once this threshold is passed, the output impedance is increased to provide more effective signal termination, thereby reducing signal over/undershoot. Such an approach is discussed by Ten Eyck in U.S. Pat. No. 6,137,322. However, the approach as illustrated in FIG. 1 has a fixed threshold which limits the range of loads the output can effectively drive. This may present a problem.

Figure 2:
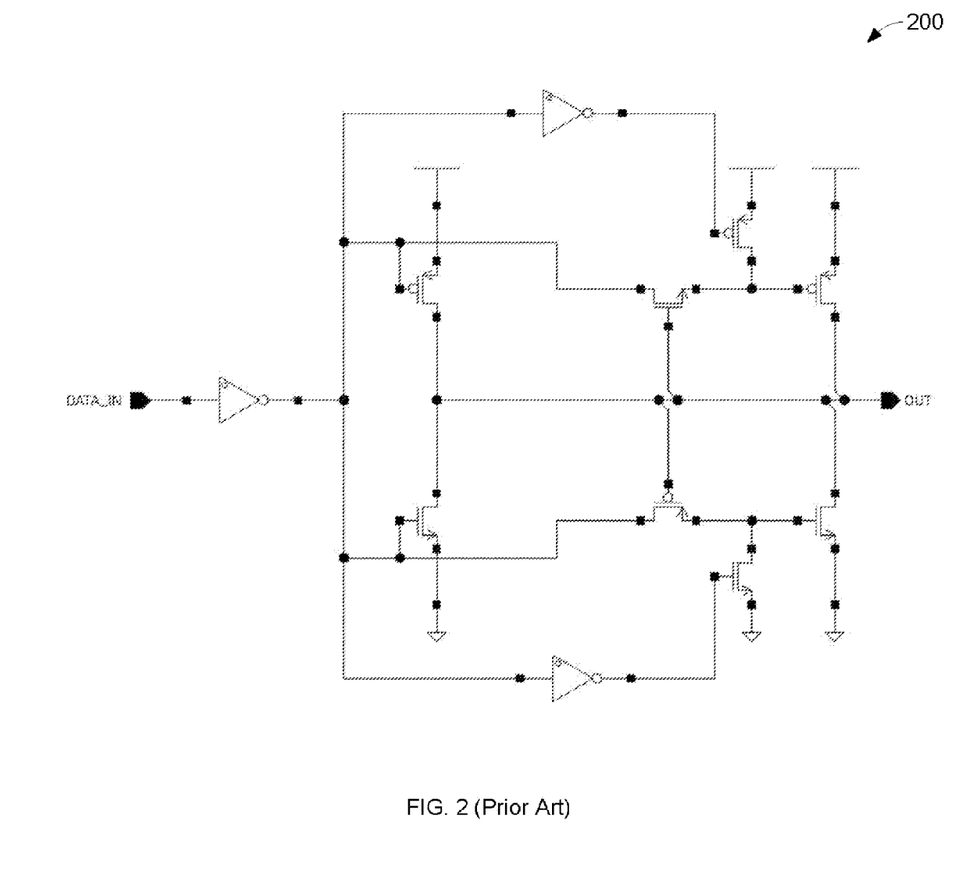

FIG. 2 illustrates another current approach 200 having an output control to reduce switching noise. One of skill in the art will recognize that FIG. 2 provides a more gradual feedback mechanism than that illustrated in FIG. 1. Such an approach is discussed by Davis in U.S. Pat. No. 5,036,222. However, the implementation in FIG. 2 uses positive feedback to increase drive strength during switching. This reduces switching-induced noise, but does not aim to reduce signal over/undershoot. This may present a problem.

Figure 3:
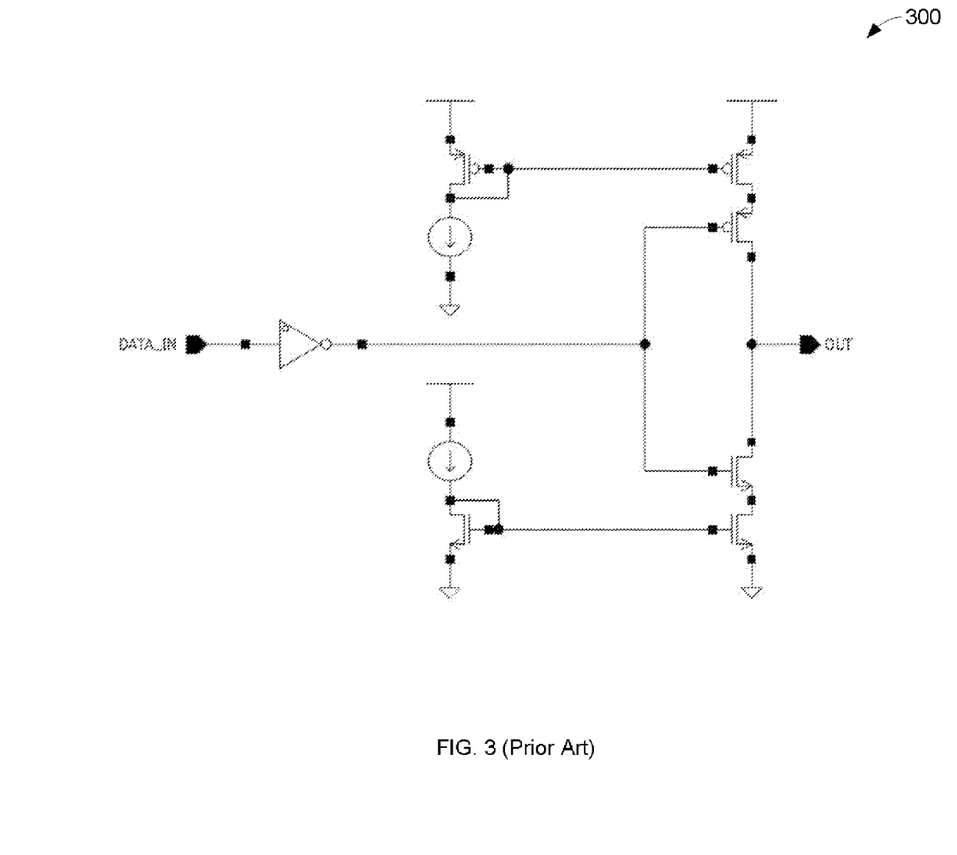

FIG. 3 illustrates another current approach 300 having a current controlled switch. One of skill in the art will recognize that FIG. 3 uses a cascoded driver stage. Such an approach is discussed by Vajdic et al. in U.S. Pat. No. 4,791,326. However, in the implementation illustrated in FIG. 3, the output drive is a fixed current and there is no feedback from the output. This may present a problem.

BRIEF DESCRIPTION OF THE DRAWINGS

The invention is illustrated by way of example and not limitation in the figures of the accompanying drawings in which.

DETAILED DESCRIPTION

The invention, as exemplified in various embodiments, illustrates how dynamic impedance control may be achieved. In one embodiment of the invention, an output buffer implements a dynamic impedance control to limit overshoot and undershoot when driving unterminated loads. In one embodiment of the invention, the impedance control is implemented with cascoded output drivers.

Figure 4:
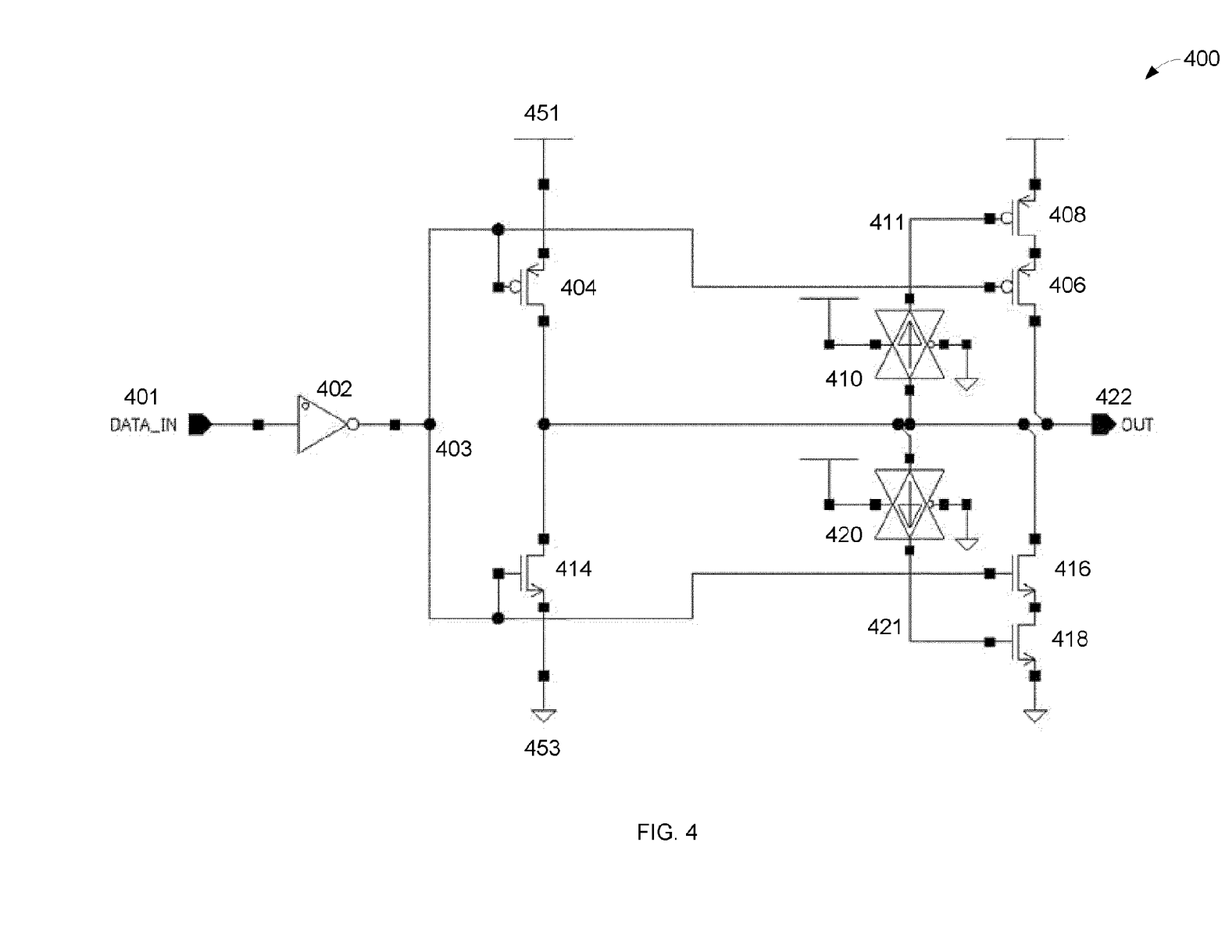
FIG. 4 illustrates one embodiment of the invention in schematic and block form.

FIG. 4 illustrates one embodiment of the invention used in an output buffer 400. Here, in a simple form of the invention, the gate closest to the output (at transistor 406, and 416) is switched with the inverse data (403), and the cascoded gate (at transistor 408, and 418) which controls impedance is connected to the output via a resistive element (shown as transmission gates (410, and 420) in the schematic); thus the impedance-control device (transistor 408, and 418) is gradually switched 'off' as the output (422) swings towards its final value.

FIG. 4 is now discussed in detail. 401 represents a data input (DATA_IN) which is communicated to inverter 402 which drives 403. 403 is connected to the gate of P channel type transistors (PMOS) 404, and 406. 403 is also connected to the gate of N channel type transistors (NMOS) 414, and 416. 451 represents a positive potential source with respect to 453. For convenience in discussion, 451 may be referred to as Vdd and 453 as GND. Vdd is connected to the source of P channel type transistors 404, and 408. GND is connected to the source of N channel type transistors 414, and 418. Vdd and GND are also connected to transmission gates 410, and 420. Output 422 (OUT) is connected to the drain of P channel type transistors 404, and 406. Output 422 (OUT) is also connected to the drain of N channel type transistors 414, and 416. Output 422 (OUT) is also connected to transmission gates 410, and 420. The gate of P channel type transistor 408 is connected via 411 to transmission gate 410. The gate of N channel type transistor 418 is connected via 421 to transmission gate 420. The drain of P channel type transistor 408 is connected to the source of P channel type transistor 406. The drain of N channel type transistor 418 is connected to the source of N channel type transistor 416.

One of skill in the art will appreciate that FIG. 4 illustrates an embodiment of the invention which uses a negative feedback mechanism to minimize under/overshoot, for example, on unterminated signal lines. The negative feedback is implemented by using cascode output drivers: one gate is controlled by the data switching signal, the other is connected (via a resistive element such as a transmission gate) to the output.

FIG. 4 illustrates the use of cascoded output stages for dynamic output control. FIG. 4 also illustrates direct feedback of the output back to the driver stage (no intermediate switching stages) between, for example, an output pad and driver control.

FIG. 4 also illustrates a simple feedback mechanism which may provide a high level of adaptability to different output loads. One of skill in the art will appreciate that the use of a cascoded output keeps output capacitance low. Additionally, the use of cascoded outputs does not need extra driver stages that subsequently must be 'turned off' (like, for example, in FIG. 1).

In one embodiment of the invention, ratioing of the fixed ('DC') driver to the impedance-controlled driver, or varying the resistance of the feedback path may change the driver behavior. For example, in FIG. 4 transistors 404, and 414 may be considered the 'DC' driver stage and transistors 406, 408, 416, and 418 the impedance controlled driver. The feedback may be considered the transmission gates 410, and 420. For example, in one embodiment of the invention, by changing the device sizes associated with these transistors and transmission gates, the output drive capability as well as the output drive characteristics (AC and DC) may be varied.

In one embodiment of the invention, the feedback path transmission gate (as exemplified in FIG. 4 at 410 and 420) may be sized such that its impedance closely matches that of the cascode driver (for example 406 and 408, and 416 and 418 in FIG. 4). This matching may minimize output buffer performance variation across process corners. Alternatively, in one embodiment of the invention, the transmission gates (as illustrated in FIG. 4 at 410 and 420) may be replaced by a simple N or P pass gate, which then allows a Vt (MOS threshold) drop to develop across the feedback path and prevent cascode turn-off before the output has transitioned more than a Vt from Vdd or GND.

In one embodiment of the invention, the feedback path may be dynamically adjusted as well. That is the feedback path may start out as a relatively high-resistance, and be switched to a lower resistance as the output transitions, through, for example a fixed threshold. This would allow more drive at the beginning of the output transition, and a faster 'turn-off' towards the end of the output transition.

In yet another embodiment of the invention, a multi-stage turn-on may be used to reduce switching-induced noise.

The arrangement of the transistors 408 and 406 which are in 'series' is often referred to as a stacked transistor array. Two or more transistors may be stacked to create the array. Since transistors 408 and 406 are driving an output, in this case 422, the array may be referred to as a stacked transistor output array (or stacked output transistor array). Note that transistors 418 and 416 are a stacked output transistor array.

Figure 5:
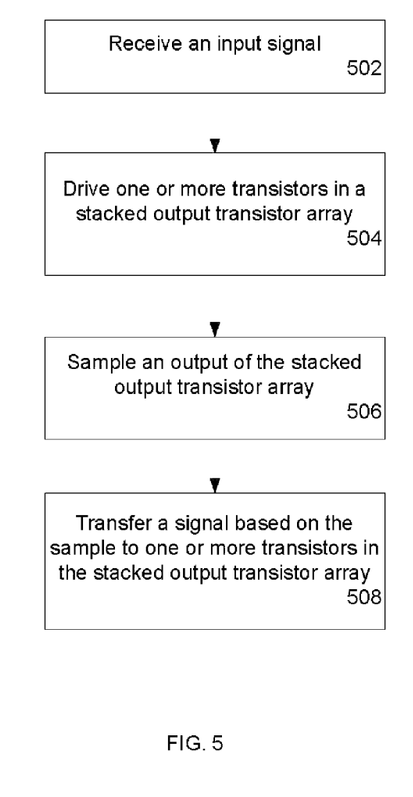
FIG. 5 illustrates one embodiment of the invention in flow chart form.

FIG. 5 illustrates one embodiment of the invention in flow chart form. At 502 an input signal is received. This signal may then be used, in one embodiment, to drive one or more transistors in a stacked output transistor array 504. At 506 a sample of the output from the stacked output transistor array is taken, and a 508 based on this sample a signal is sent to one or more of the transistors in the stacked output transistor array.

Figure 6:
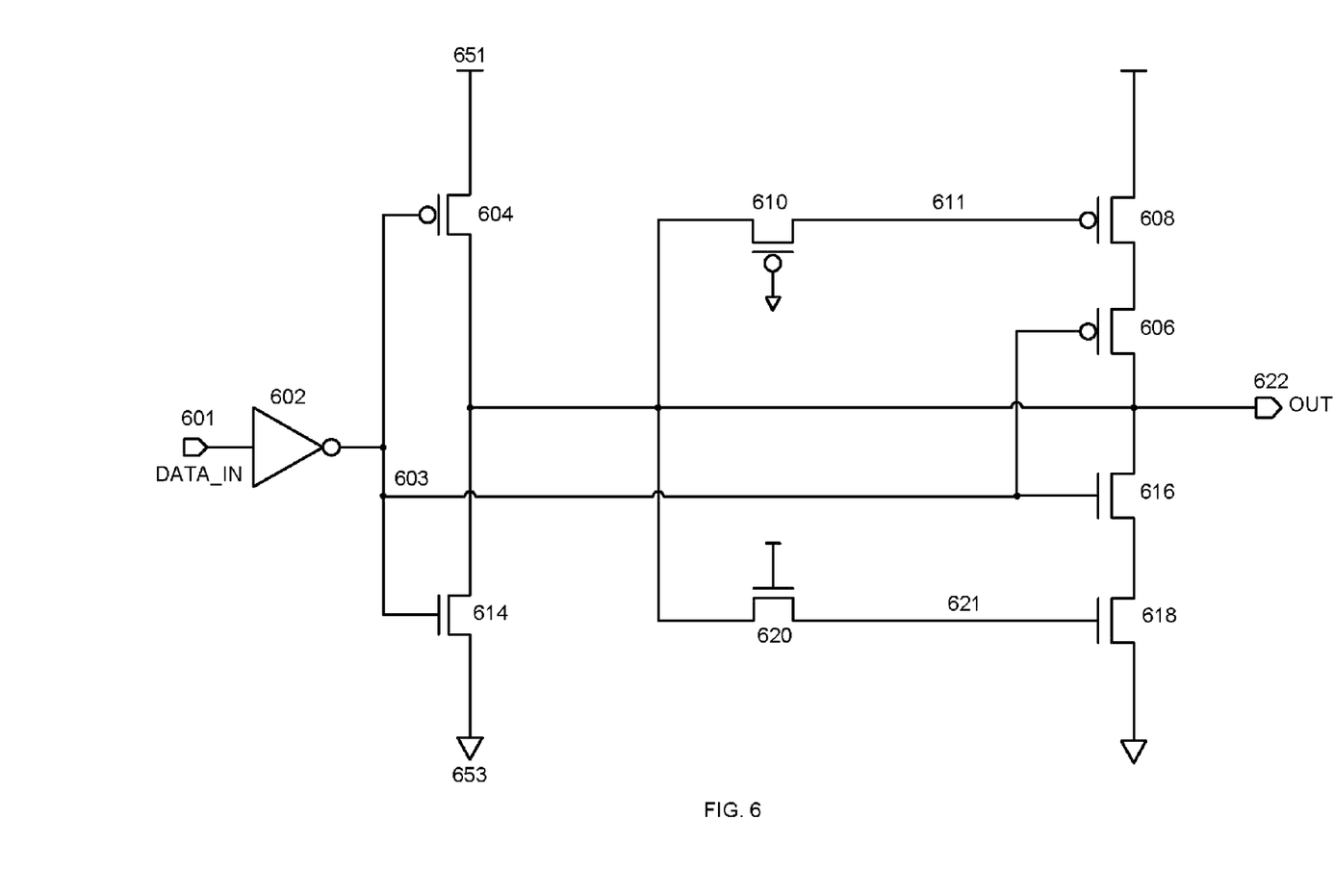
FIG. 6 illustrates one embodiment of the invention using N and P pass gate transistors for feedback elements.

FIG. 6 illustrates one embodiment of the invention using N and P pass gate transistors for feedback elements. P transistor 610 and N transistor 620 provide feedback from the output (Out) 622 to the transistors 608 and 618 respectively. One of skill in the art will appreciate that by using N and P devices as pass elements, this allows a Vt (MOS threshold) drop to develop across the feedback path and prevents cascode turn-off before the output has transitioned more than a Vt from Vdd or GND. For example, when the output transitions from, for example, GND at 0v to Vdd, the output must be greater than a PMOS threshold (VtPMOS) before transistor 610 will conduct and pull up node 611. For example, when transitioning from Vdd to 0V (GND), the output must be less than (Vdd−VtNMOS) before transistor 620 will conduct and pull down node 621.

FIG. 6 is now discussed in detail. 601 represents a data input (DATA_IN) which is communicated to inverter 602 which drives 603. 603 is connected to the gate of P channel type transistors (PMOS) 604, and 606. 603 is also connected to the gate of N channel type transistors (NMOS) 614, and 616. 651 represents a positive potential source with respect to 653. For convenience in discussion, 651 may be referred to as Vdd and 653 as GND. Vdd is connected to the source of P channel type transistors 604, and 608. GND is connected to the source of N channel type transistors 614, and 618. Vdd is also connected to the gate of N channel type transistor 620. GND is also connected to the gate of P channel type transistor 610. Output 622 (OUT) is connected to the drain of P channel type transistors 604, and 606. Output 622 (OUT) is also connected to the drain of N channel type transistors 614, and 616. Output 622 (OUT) is connected to the source of transistor 610, and to the drain of transistor 620. The drain of transistor 610 is connected via 611 to the gate of transistor 608. The source of transistor 620 is connected via 621 to the gate of transistor 618. The drain of P channel type transistor 608 is connected to the source of P channel type transistor 606. The drain of N channel type transistor 618 is connected to the source of N channel type transistor 616.

Figure 7:
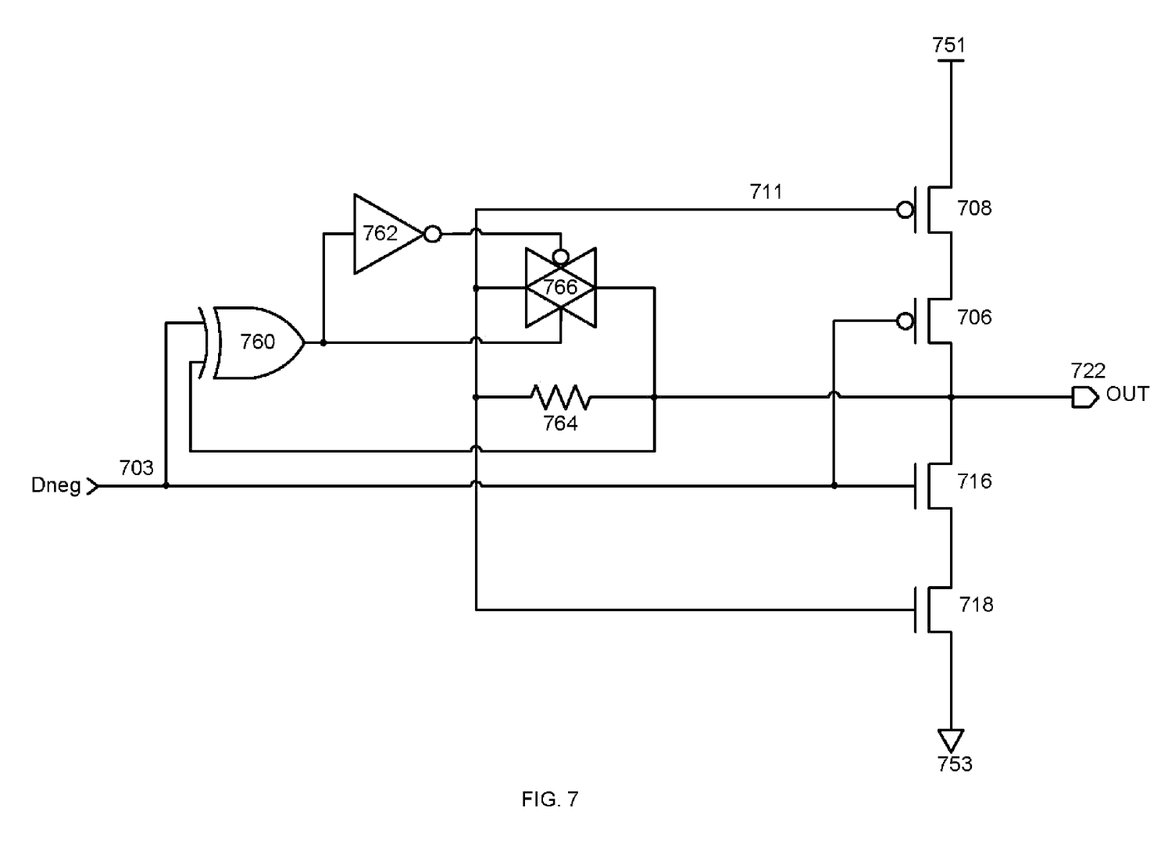
FIG. 7 illustrates one embodiment of the invention where the feedback path may start as relatively high-resistance, and be switched to lower resistance as the output transitions through a threshold.

FIG. 7 illustrates one embodiment of the invention where the feedback path may start as relatively high-resistance, and be switched to lower resistance as the output transitions through a threshold. FIG. 7 does not show any parallel drivers such as transistors 404 and 414 in FIG. 4. Dneg, the input (which is inverted), may be considered a signal such as 403 in FIG. 4 for understanding purposes.

In FIG. 7 a resistive element 764 provides an initial 'high-resistance'. In FIG. 7 the output (OUT 722) is monitored, in this embodiment by a simple CMOS device (XOR 760) whose detection point threshold (assuming GND=0V) would nominally be Vdd/2. As the output transitions through this threshold, a low-impedance path ('TG', transmission gate 766) is turned on (which is in parallel with 764), thereby increasing the negative feedback.

In FIG. 7, Dneg the input is connected to XOR 760, and the gate of transistor 706 and 716. The OUT 722 is connected to transistor 706 and 716, one side of resistor 764, one side of transmission gate 766, and one input of XOR 760. The output of XOR 760 is connected to inverter 762 and one control terminal of transmission gate 766. The output of inverter 762 is connected to the other control terminal of transmission gate 766. The other side of transmission gate 766, the other terminal of resistor 764, and the gates of transistors 708 and 718 are connected via 711. 751 represents Vdd a more positive voltage than 753 which denotes GND.

One of skill in the art will appreciate that in alternative embodiments of the invention other implementations are possible. For example, the output rather than being monitored by a simple CMOS device could be more complicated, eg: comparing the output with a reference voltage using a differential input, etc. Additionally, other variations may include two separate feedback paths for pullup and pulldown and these could also have two different threshold levels.

Figure 8:
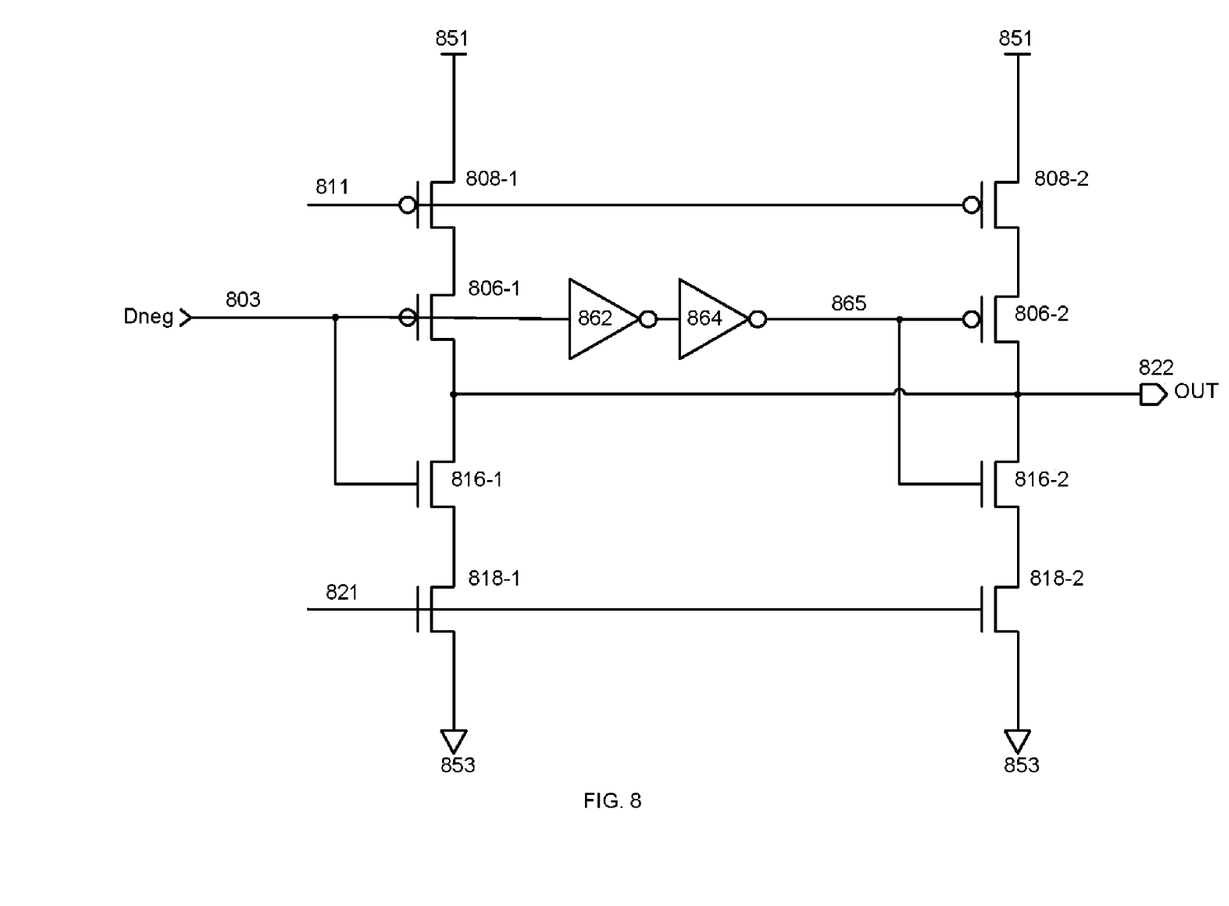
FIG. 8 illustrates one embodiment of the invention showing staged switching.

FIG. 8 illustrates one embodiment of the invention showing staged switching. In FIG. 8 a multi-stage turn-on/turn-off is used to reduce switching-induced noise. The output is split into stages that are turned on at different times, generally delayed by fractions of the output rise/fall time. A multi-stage approach may use two or more stages. By switching at different points in time, the current associated with switching is spread over a time interval as the multiple stages switch resulting in a lower peak current versus a single large stage switching at a single point in time.

In FIG. 8 transistors 808-1, 806-1, 816-1, and 818-1 may be considered a first output stage. Transistors 808-2, 806-2, 816-2, and 818-2 may be considered a second output stage. Dneg the input 803 initially drives the first output stage. Signal 803 is then delayed by inverters 862 and 864 and the delayed signal 865 drives the second output stage. 811 represents P channel type transistor feedback control as illustrated in various embodiments of the present invention, and as discussed. 821 represents N channel type transistor feedback control as illustrated in various embodiments of the present invention, and as discussed. 851 denotes a positive supply voltage with respect to 853. Out 822 is connected to each output stage (denoted here as the junction of 806-1 and 816-1, and 806-2 and 816-2).

Figure 9:
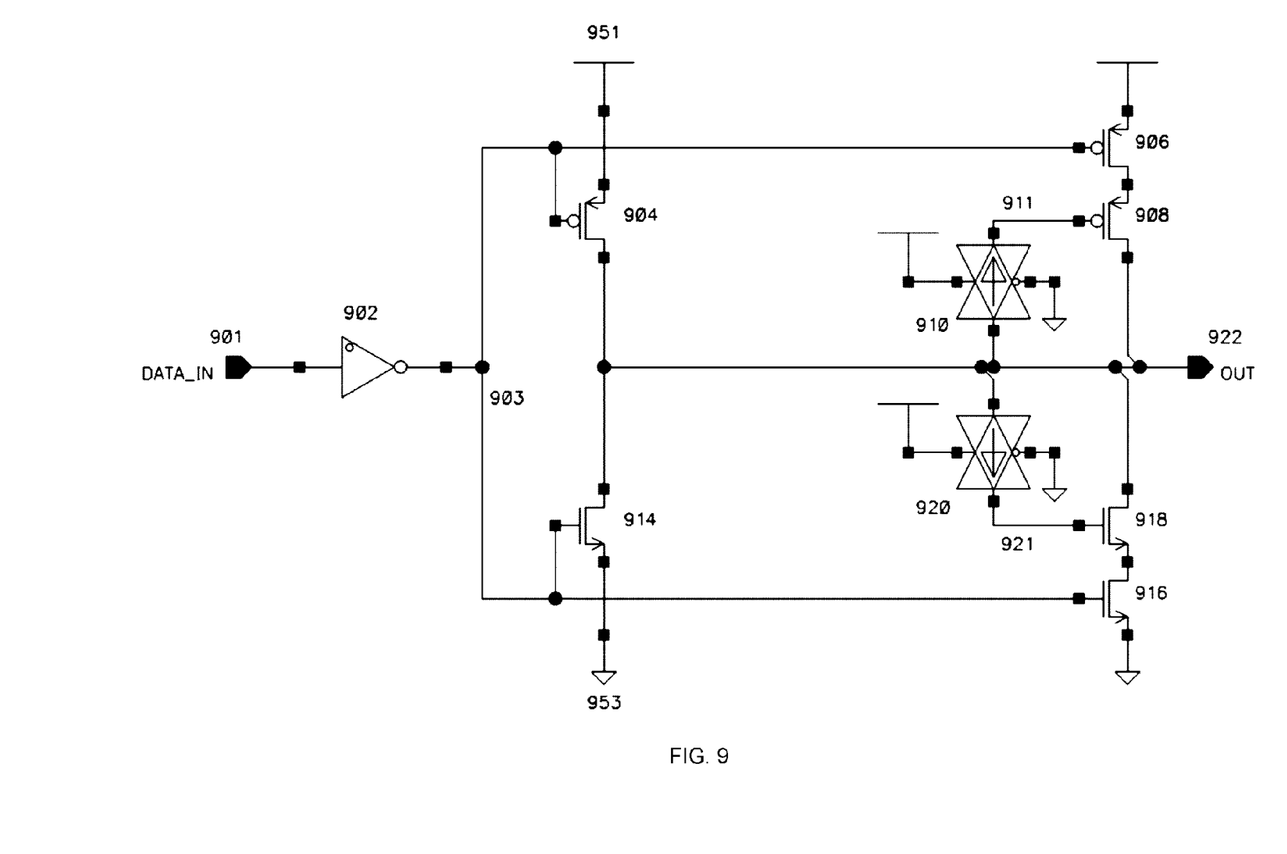
FIG. 9 illustrates one embodiment of the invention controlling the transistors which are directly tied to an output.

FIG. 9 illustrates one embodiment of the invention controlling the transistors which are directly tied to an output. In comparison with FIG. 4, the gate furthest from the output (at transistor 906 and 916) is switched, and the cascaded gate (at transistor 908 and 918) which controls impedance is connected to the output (922).

One of skill in the art will appreciate that this alternative embodiment results in greater negative feedback than that provided in FIG. 4, with faster cascode turn-off.

FIG. 9 is now discussed in detail. 901 represents a data input (DATA_IN) which is communicated to inverter 902 which drives 903. 903 is connected to the gate of P channel type transistors (PMOS) 904, and 906. 903 is also connected to the gate of N channel type transistors (NMOS) 914, and 916. 951 represents a positive potential source with respect to 953. For convenience in discussion, 951 may be referred to as Vdd and 953 as GND. Vdd is connected to the source of P channel type transistors 904, and 906. GND is connected to the source of N channel type transistors 914, and 916. Vdd and GND are also connected to transmission gates 910, and 920. Output 922 (OUT) is connected to the drain of P channel type transistors 904, and 408. Output 922 (OUT) is also connected to the drain of N channel type transistors 914, and 918. Output 422 (OUT) is also connected to transmission gates 910, and 920. The gate of P channel type transistor 908 is connected via 911 to transmission gate 910. The gate of N channel type transistor 918 is connected via 921 to transmission gate 920. The drain of P channel type transistor 906 is connected to the source of P channel type transistor 908. The drain of N channel type transistor 916 is connected to the source of N channel type transistor 918.

Figure 10A:
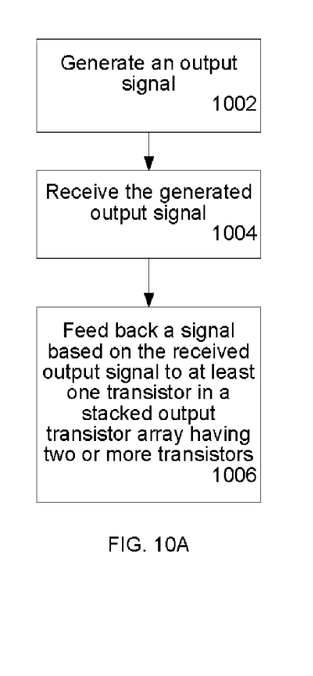
FIG. 10A, FIG. 10B, FIG. 10C, and FIG. 10D illustrate embodiments of the present invention.
Figure 10B:
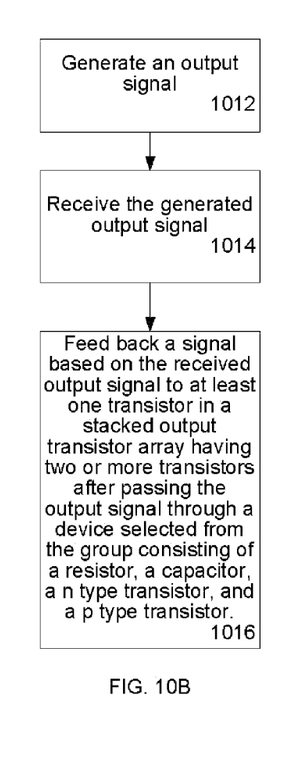
Figure 10C:
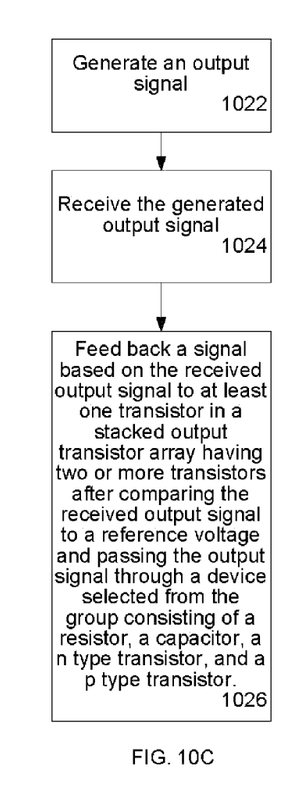
Figure 10D:
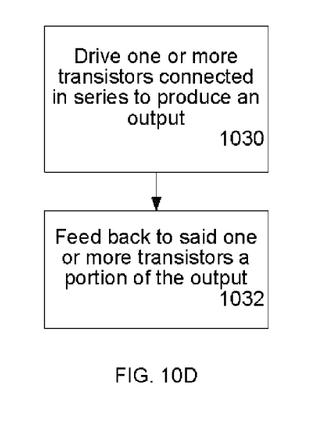

FIG. 10A, FIG. 10B, FIG. 10C, and FIG. 10D illustrate embodiments of the present invention. In FIG. 10A at 1002 an output signal is generated. At 1004 the output signal that was generated is received. At 1006 a signal is fed back based on the received output signal to at least one transistor in a stacked output transistor array having two or more transistors. In FIG. 10B at 1012 an output signal is generated. At 1014 the output signal that was generated is received. At 1016 a signal is fed back based on the received output signal to at least one transistor in a stacked output transistor array having two or more transistors after passing the output signal through a device selected from the group consisting of a resistor, a capacitor, a n type transistor, and a p type transistor. In FIG. 10C at 1022 an output signal is generated. At 1024 the output signal that was generated is received. At 1026 a signal is fed back based on the received output signal to at least one transistor in a stacked output transistor array having two or more transistors after comparing the received output signal to a reference voltage and passing the output signal through a device selected from the group consisting of a resistor, a capacitor, a n type transistor, and a p type transistor. In FIG. 10D at 1030 one or more transistors connected in series are driven to produce an output. At 1032 a portion of the output is fed back to one or more of the transistors that produced the output.

One of skill in the art will appreciate that in alternative embodiments of the invention other implementations are possible. For example, the output rather than being monitored by a simple CMOS device could be more complicated, eg: comparing the output with a reference voltage using a differential input, etc. Additionally, other variations may include two separate feedback paths for pullup and pulldown and these could also have two different threshold levels.

Thus a method and apparatus for an output buffer with dynamic impedance control have been described.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of skill in the art that the present invention may be practiced without these specific details. In some instances, well-known structures and devices are shown in block diagram form, rather than in detail, in order to avoid obscuring the present invention. These embodiments are described in sufficient detail to enable those of skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of skill in the data processing arts to most effectively convey the substance of their work to others of skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities.

Further, any of the methods according to the present invention can be implemented in hard-wired circuitry, by programmable logic, or by any combination of hardware and software.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software.

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for an output buffer with dynamic impedance control have been described.

What is claimed is:

1. A method comprising:
generating an output signal from a node of two stacked P-type transistors and two stacked N-type transistors;
receiving said output signal;
feeding back a first signal based on said received output signal by passing said received output signal through a P-type transistor connected to at least one transistor in said two stacked P-type transistors; and
feeding back a second signal based on said received output signal by passing said received output signal through a N-type transistor connected to at least one transistor in said two stacked N-type transistors.

2. The method of claim 1 wherein said feeding back further comprises a comparison of said received output signal to a reference voltage.

\* \* \* \* \*